United States Patent [19]

Massopust

[11] Patent Number: 4,813,128
[45] Date of Patent: Mar. 21, 1989

[54] HIGH DENSITY DISPOSABLE PRINTED CIRCUIT INTER-BOARD CONNECTOR

[75] Inventor: Dan Massopust, Menomonie, Wis.

[73] Assignee: Cray Research, Inc., Minneapolis, Minn.

[21] Appl. No.: 143,572

[22] Filed: Jan. 13, 1988

[51] Int. Cl.$^4$ ............................ H01R 11/16; H01R 9/09
[52] U.S. Cl. ................................. 29/830; 174/84 R; 439/875
[58] Field of Search ............... 439/874, 875, 876, 74, 439/75; 174/84 R; 29/830, 840, 843

[56] References Cited

U.S. PATENT DOCUMENTS

| | | | |
|---|---|---|---|
| 2,845,516 | 7/1958 | Jones | 174/84 R |
| 2,846,659 | 8/1958 | Hinspater | 439/875 |
| 3,818,123 | 6/1974 | Maltz et al. | 439/874 |
| 4,026,412 | 5/1977 | Henson | 439/68 |
| 4,550,959 | 11/1985 | Grabbe et al. | 29/843 |
| 4,637,542 | 1/1987 | Breske et al. | 228/180.1 |
| 4,664,643 | 2/1987 | Sudo | 29/845 |
| 4,723,924 | 2/1988 | Morrison | 439/875 |

OTHER PUBLICATIONS

IBM Bulletin, Martyak, vol. 14, No. 8, p. 2297, 1-1972.

Primary Examiner—Neil Abrams
Attorney, Agent, or Firm—Merchant, Gould, Smith, Edell, Welter & Schmidt

[57] ABSTRACT

A connector frame for use in the connection of electrical circuit assemblies having pins integrally connected therewith. The connector frame is a body of electrically non-conductive, thermally conductive material having one or more apertures bored through the body, said apertures being through-plated with an electrically-conductive material having a lower melting point than any of the surrounding materials. Said body also includes at least one separate aperture in which is disposed an electrically-conductive, heat-generating wire, said wire having the capacity to generate sufficient heat to melt the electrically-conductive material disposed in the apertures to form a strong electrical and mechanical bond between the pins of the electrical circuit assemblies.

3 Claims, 2 Drawing Sheets

HIGH DENSITY DISPOSABLE PRINTED CIRCUIT INTER-BOARD CONNECTOR

TECHNICAL FIELD OF THE INVENTION

The present invention relates to a disposable connector frame for use in detachably connecting a pair of electronic assemblies.

BACKGROUND OF THE INVENTION

Current methods of printed circuit inter-board connection utilize connectors which do not always provide a reliable electrical and strong mechanical bond due to the nature of a removable or reusable connection. Some prior art printed circuit board connectors often require that a large amount of force be exerted to connect the printed circuit boards either directly or through interconnecting blocks. After connection has been formed, the holding force of these types of printed circuit board connectors often makes the printed circuit boards difficult to disconnect.

To achieve a higher degree of reliability in prior art reuseable connectors, a scraping action to cut through oxide buildup to form a positive electrical connection is required. Miniaturization of components is sometimes limited in the prior art due to the force and scraping action requirements, so the number of pins on the printed circuit boards which may be effectively interconnected is correspondingly limited.

The present invention overcomes the above-enumerated problems and other shortcomings associated with current printed circuit board connection devices by providing a semi-permanent connector which forms a strong mechanical and electrical bond without the need of high insertion force or scraping action.

SUMMARY OF THE INVENTION

The present invention relates to a connector frame for use in the connection of printed circuit boards or other electronic assemblies having pins integrally connected therewith, the connector frame comprising a body of electrically non-conductive material having one or more apertures bored through said body, the placement of said apertures corresponding to the placement of the pins on the printed circuit boards, such that said pins are aligned with said apertures and bonded together with a low melting point solder heated from a heater wire.

The present invention also relates to a connector frame for use in the connection of printed circuit boards and when in use disposed between a pair of printed circuit boards, said printed circuit boards having pins integrally connected therewith, said connector frame comprising a body of electrically non-conductive, thermally conductive material having one or more apertures bored through said body, said apertures being through-plated with an electrically conductive material having a lower melting point than any of the surrounding materials; the placement of said apertures corresponding to the placement of said pins on said printed circuit boards, such that said pins are aligned with and inserted into said apertures. Said body also includes an electrically conductive, heat-generating wire, said wire when energized having the capacity to generate sufficient heat to melt the electrically conductive material disposed in the apertures such that, in use, the pins are electrically and mechanically connected between the circuit boards by said melting electrically conductive material. When said wire is deenergized, said electrically conductive material cools and solidifies forming a semi-permanent electrical and mechanical bond.

The present invention also relates to a disposable connector frame for use in the interconnection of printed circuit boards and when in use disposed between a pair of printed circuit boards, said printed circuit boards having one or more pins integrally connected therewith, said connector frame comprising a body of electrically non-conductive, thermally conductive, and inexpensive material, such as plastic or nylon, having one or more apertures bored through said body in a substantially vertical direction in axial alignment with the pins connected to said circuit boards. Said vertically disposed apertures being filled with an electrically conductive material having a lower melting point than any of the surrounding materials, such as solder and the centers of said apertures are drilled out to form vertical holes having an approximate diameter less than said apertures but greater than said pins. Each of said pins has a length extending through slightly less than one-half the length of said vertically disposed holes, such that the vertically aligned pins of each circuit board do not meet within the vertically disposed holes. Said body also includes at least one aperture in which is disposed an electrically conductive, heat-generating wire, said wire having the capacity to generate sufficient heat to melt the electrically conductive material disposed in the substantially vertical apertures, but does not interconnect with said vertically disposed apertures.

An advantage of one embodiment of the present invention is that it is a zero-insertion-force connector, so the printed circuit boards are easily connected.

Another advantage of one embodiment of the present invention is that it forms a strong electrical and mechanical bond between sandwiched printed circuit boards.

Yet another advantage of one embodiment of the present invention is that no scraping action to cut through oxide buildup such as may be required in the use of current printed circuit board connectors is mandated.

Still another advantage of one embodiment of the present invention is its capacity to be miniaturized to a great degree, thus allowing compatability with other miniaturized electrical components.

Still another advantage of one embodiment of the present invention is its low cost, such that the connector may be disposable in nature.

Still another advantage of one embodiment of the present invention is that connected printed circuit boards may be easily disconnected.

The above described features and advantages, along with various other advantages and features of novelty, are pointed out with particularity in the claims annexed hereto and forming a part hereof. However, for a better understanding of the invention, its advantages, and objects attained by its use, reference should be had to the drawings which form a further part hereof and to the accompanying descriptive matter in which there is illustrated and described a preferred embodiment of the invention.

BRIEF DESCRIPTION OF THE DRAWINGS

In the drawings, in which like reference numbers indicate corresponding parts throughout the several views.

DETAILED DESCRIPTION OF A PREFERRED EMBODIMENT OF THE INVENTION

In the following detailed description of the preferred embodiment, reference is made to the accompanying drawings which form a part hereof, and in which is shown by way of illustration a specific embodiment in which the invention may be practiced. This embodiment is described in sufficient detail to enable those skilled in the art to practice the invention and it is to be understood that other embodiments may be utilized and that structural changes may be made without departing from the scope of the present invention. The following detailed description is, therefore, not be taken in a limiting sense, and the scope of the present invention is defined by the appended claims.

Figure 1:
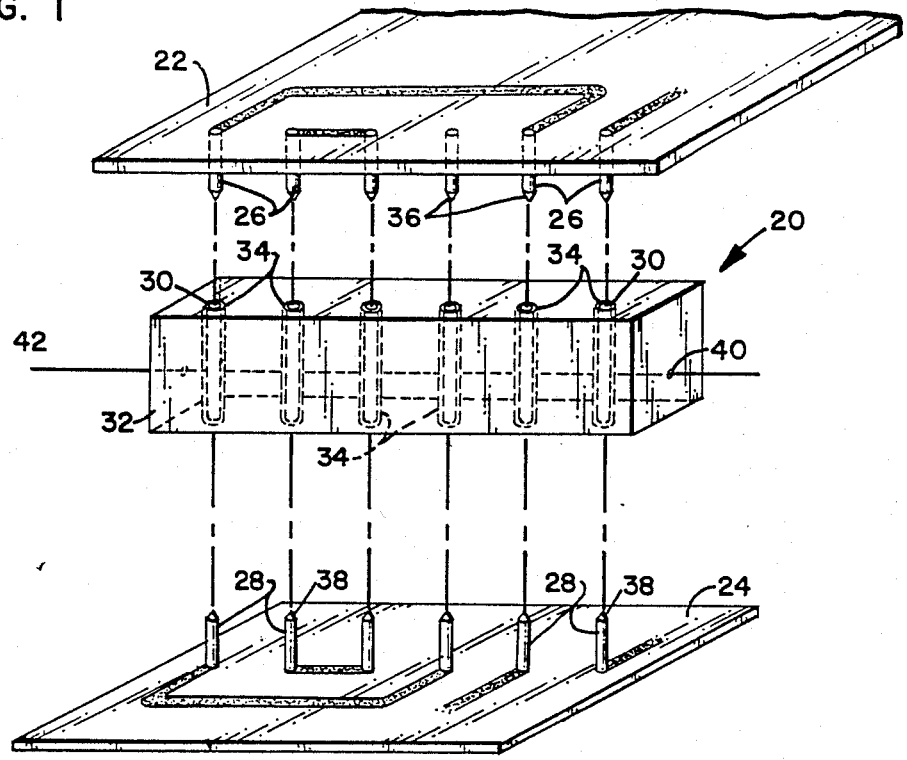
FIG. 1 is a perspective view of a connector frame and two printed circuit boards (PCB's) in accordance with the principles of the present invention.
Figure 2:
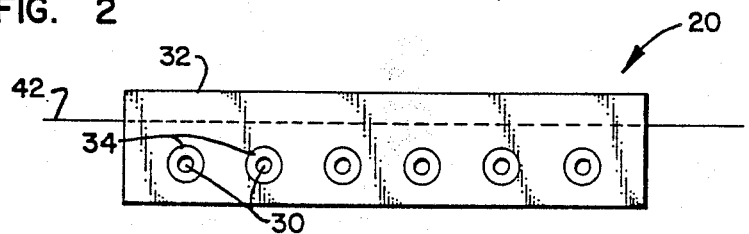
FIG. 2 is a cross-sectional view of a connector frame in accordance with the principles of the present invention, showing coated holes and a heater wire as viewed from the top.

Referring now to the drawings, there is illustrated in FIGS. 1 and 2 an embodiment of a connector frame 20 in accordance with the principles of the present invention. The body 32 of the connector block or frame 20 is made of an electrically non-conducting material such as nylon or plastic and is either cut from a bulk material or molded. In molding, the apertures 30 and 40 could be pre-cast or could be bored after molding.

The connector frame 20 is depicted as being able to detachably connect two printed circuit boards, upper printed circuit board (PCB) 22 and lower printed circuit board (PCB) 24. Both upper PCB 22 and lower PCB 24 possess a number of pins disposed in a generally perpendicular direction to the substantially flat surfaces of PCBs 22 and 24 and integrally connected therewith; said pins hereinafter referred to as upper pins 26 and lower pins 28, respectively. These upper and lower pins 26,28 are in alignment with each other in a substantially vertical direction (perpendicular to the surfaces of the PCBs 22, 24 and the connector frame 20), as well as in substantially vertical alignment with apertures 30 bored through the body 32 of the connector frame 20. Those skilled in the art will readily recognize that the PCB pins may be at angles other than perpendicular, such as edge connector pins protruding substantially parallel to the planar surfaces of the PCB's. Also, the interconnection can be made to a backplane or to smaller components or component carriers such as from PCB to backplane, PCB mother board to PCB daughter board, PCB to chip carrier, PCB to chip, etc.

Apertures 30 are through-plated or filled with an electrically conductive material having a lower melting point than any of the surrounding materials; in the preferred embodiment, this material is a low-temperature solder such as indalloy #8. Through-plating in the preferred embodiment is performed by boring the apertures 30, filling said apertures with molton solder, then boring out the centers of the soldered holes after the solder solidifies, such that a coating of solder remains disposed on the walls 34 of apertures 30. Through-plating may be performed in an alternate embodiment by boring the apertures 30 and inserting therein drawn solder having a flux filled interior sized to be slightly larger than the pins 26 and 28. The flux flows upon application heat and opens the centers of the solder to form holes for accepting the pins 26 and 28. The flux serves the additional purpose of aiding the solder connection process as is well-known in the art.

The length of apertures 30 is such that when connector frame 20 is pressed between upper PCB 22 and lower PCB 24, upper pins 26 and lower pins 28 each extend into apertures 30, so that the ends 36 and 38 of the pins 26 and 28 do not meet. This requirement ensures a strong mechanical bond since the surfaces of PCB's 22 and 24 are pressed and held firmly against the connector block 20. Those skilled in the art will recognize that the pins may be allowed to meet or the pins may be partially inserted at a cost of giving up mechanical rigidity.

A horizontal aperture 40 disposed at a substantially 90 degree angle to vertical apertures 30, is also bored in the connector frame 20 of the preferred embodiment of the invention. Contained within and running through this horizontal aperture 40 is an electrically conductive, heat-generating wire 42, which in the preferred embodiment is formed of a material such as NiChrome. The wire 42 of the preferred embodiment is electrically insulated from both the upper and lower pins 26 and 28, as well as from vertical apertures 30 in which said pins 26 and 28 are disposed, such that the connector block 20 is heated when current is passed through wire 42. Heat generated by the wire 42 is conducted through the body 32 of the connector frame 20 in sufficient degree to melt the low-temperature solder disposed upon the walls 34 of vertical apertures 30.

Melting of the low-temperature solder within vertical apertures 30 causes an electrically conducting conduit to be formed between upper and lower pins 26 and 28, thus establishing an electrical contact between PCBs 22 and 24. The current is removed from wire 42 and the molten solder is then allowed to cool, such that the electrical conduit remains. When disconnection of PCBs 22 and 24 is desired, current may again be established in the NiChrome wire 42 of the preferred embodiment, such that heat generated by said wire 42 will again melt the solder disposed in vertical apertures 30. After said solder is molten, PCBs 22 and 24 may be easily pulled apart. Connector frame 20 may then be discarded, a feasible option since the cost per unit for the construction of connector frame 20 is very low.

Dimensions of elements contained in the preferred embodiment of the invention are very small; for example, upper and lower pins 26 and 28, formed in the preferred embodiment of a high conductive metal such as beryllium copper, may be approximately 4 mils in diameter. The inertia diameters of the vertical apertures 30 after soldering has occurred may be 5 mils, while the outer diameters of the apertures 30 may be 10 mil, such that a 5 mil in diameter coating of solder would be disposed on the walls of the vertical apertures 30. By selecting the aforementioned dimensions, a staggered spacing of 10 mil holes would allow up to 1000 holes per inch on a single connector. The NiChrome wire 42 could be selected on the current required to heat 1000 holes per inch. The size of the NiChrome wire would vary based on the current capacity and heat generation requirements. Those skilled in the art will readily recognize that a wide variation in the size and spacing of the holes is possible without deviating from the spirit and scope of the present invention as described in the appended claims.

In use, the connector frame 20 is pressed between PCBs 22 and 24, such that pins 26 and 28 are disposed in solder-coated vertical apertures 30. Electrical current is then established in the NiChrome wire 42, which generates enough heat to melt the solder disposed on walls 34 of apertures 30. Melting of the solder causes an electrically conductive conduit to be formed between pins 26 and 28, thus establishing an electrical contact between PCBs 22 and 24. The molten solder is then allowed to cool, such that the electrical contact remains. This electrical contact may be maintained for as long as is desired, until disconnection of PCBs 22 and 24 is warranted. When disconnection of PCBs 22 and 24 is desired, an electrical current is again established in the NiChrome wire 42, such that the heat generated by said wire 42 will again melt the solder. After the solder is molten, PCBs 22 and 24 may be easily pulled apart, and the connector frame 20 may be discarded.

Those skilled in the art will readily recognize a wide variety of variations on the preferred embodiment of the present invention which do not depart from the spirit and scope of the present invention. For example, the connector block may be bored with holes aligned at right angles to allow the interconnection of circuit boards meeting at right angles. A wide variety of angular interconnections is possible by varying the angles of the apertures in connector block 20.

Connector block 20 itself need not be rectangular in shape but may in fact be of fewer or many sides such as an octagon allowing interconnection of a plurality of circuit boards. In an octagonal application, four bore holes could be made all of which meet at the center of the octagon-shaped connector block. The four bore holes could then all be filled with a low temperature solder allowing the interconnection of eight pins from eight different circuits. The pins 26 and 28 of circuit boards 22 and 24 respectively need not be perpendicular to the surface of the circuit boards but may in fact be attached to the edges to allow the circuit boards to be inserted into multi-shaped connector blocks 20. The apertures 34 need not be bored circular in shape but may in fact be carved or molded in a wide variety of shapes. The through-plating of the holes 34 may be accomplished by a wide variety of plating mechanisms such as electroplating, electrolessplating or sputtering. The plating of holes 34 need not be complete in that a partial plating of the holes could be sufficient to form an electrical bond between pins 26 and 28.

Figure 3:
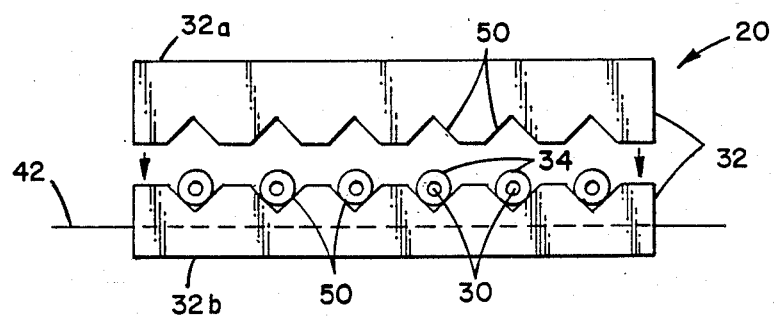
FIG. 3 is a cross-sectional view of a connector frame in accordance with the principles of the present invention, showing an alternate construction technique based on V-block etching or milling.

An alternate method of constructing the present invention is shown in FIG. 3 in which a two-piece connector block 32 is comprised of an upper connector block piece 32a and a lower connector block piece 32b. Grooves 50 having a V-shape or other cross-sectional shape are etched or milled into connector block 32. The groove 50 are placed on the connector block pieces 32a and 32b in a corresponding relationship. The solder sections 34 having interior holes 30 may be placed in the grooves 50 before the grooved blocks 32a and 32b are fastened together by conventional means along the direction indicated by the arrows in FIG. 3. The solder sections 34 may be constructed according to techniques previously described such as hollow cylinders of solder, through-plating, electroplating and the like. The NiChrome heating wire 42 may be placed in either or both of the connector block pieces 32a and 32b for heating during assembly and removal of the connector block 32.

The heater wire 42 may be constructed as an integral non-removable portion of the connector blocks previously described or it could be constructed to be removable or replaceable. A replaceable heater wire may be advantageous where the possibility exists that an integrated connector wire 42 could be damaged or broken during the heating process. In this fashion, a connector block could not be removed with a break in the heater wire 42. By using a replaceable heater wire 42 placed in aperture of the connector block 32, the danger of a broken heater wire making the connector block non-removable can be eliminated.

The NiChrome heater wire 42 need not necessarily be formed perpendicular to the holes 34 to melt the low temperature solder. The electrically conducting wire may be snaked in any particular fashion throughout the connector block as long as a sufficient heat is imparted to each through-plated hole 34 to allow the low temperature solder to melt. The heater wire 42 may be made a permanent part of connector block 20 or may be inserted only when required for heating.

While the present invention has been described in connection with the preferred embodiment thereof, it will be understood that many modifications will be readily apparent to those of ordinary skill in the art, and this application is intended to cover any adaptations or variations thereof. Therefore, it is manifestly intended that this invention be limited only by the scope of the claims and the equivalents thereof.

What is claimed is:

1. A method of manufacturing a connector block for use in the connection of pins between electronic circuit assemblies, said method comprising the steps of:
   (a) forming a first part of a body of the connector block from an electrically non-conductive material;
   (b) forming a second part of the connector body from an electrically non-conductive material;
   (c) placing corresponding grooves in both the first part and the second part of the connector block;
   (d) placing a low temperature solder within the grooves of the first part and the second part;
   (e) attaching the first part and the second part of the connector block such that the low temperature solder is aligned in the grooves of the connector block; and
   (f) placing an electrically conductive, heat generating wire in at least one of said parts of the connector block.

2. The method according to claim 1 wherein said steps (d) and (e) are reversed in order.

3. The method according to claim 2 wherein said step of placing a low temperature solder in the grooves is accomplished using through-plating.

* * * * *